United States Patent [19]
Toth

[11] 3,975,643
[45] Aug. 17, 1976

[54] FAIL-SAFE OPTO-ELECTRONIC PHASE INVERTING CIRCUITS

[75] Inventor: Charles V. Toth, McKeesport, Pa.

[73] Assignee: Westinghouse Air Brake Company, Swissvale, Pa.

[22] Filed: Jan. 23, 1974

[21] Appl. No.: 435,679

[52] U.S. Cl. ............................. 250/551; 250/209; 207/311; 321/51; 328/155
[51] Int. Cl.² .................. H01J 39/12; G02B 27/00
[58] Field of Search ............... 250/208, 209, 551; 307/111, 317; 330/59; 321/51; 328/155; 323/119

[56] References Cited
UNITED STATES PATENTS

| | | | |
|---|---|---|---|
| 3,167,657 | 1/1965 | Vize | 250/208 |
| 3,524,986 | 8/1970 | Harnden, Jr. | 250/551 X |
| 3,584,286 | 6/1971 | Randall | 323/119 |
| 3,671,749 | 6/1972 | Harnden, Jr. | 250/208 |
| 3,696,250 | 10/1972 | Weimer | 250/553 |
| 3,696,389 | 10/1972 | Fenner | 250/553 X |
| 3,717,770 | 2/1973 | Dyck et al. | 307/117 X |
| 3,723,769 | 3/1973 | Collins | 307/311 X |
| 3,812,364 | 5/1974 | Rougeot | 307/117 X |

*Primary Examiner*—Walter Stolwein
*Attorney, Agent, or Firm*—J. B. Sotak; R. W. McIntire, Jr.

[57] ABSTRACT

This disclosure relates to a vital type of an optoelectronic phase inverting circuit arrangement employing a plurality of cascaded photon coupled isolators. Each of the photon coupled isolators includes a light emitting diode and an associated light responsive transistor. A source of periodic input signals is coupled to the photon coupled isolators so that electrical energy is converted to light energy by the light emitting diodes to control the conductive conditions of the respective light responsive transistors whereby the periodic input signals are inverted 180° barring the presence of a critical component or circuit failure.

7 Claims, 5 Drawing Figures

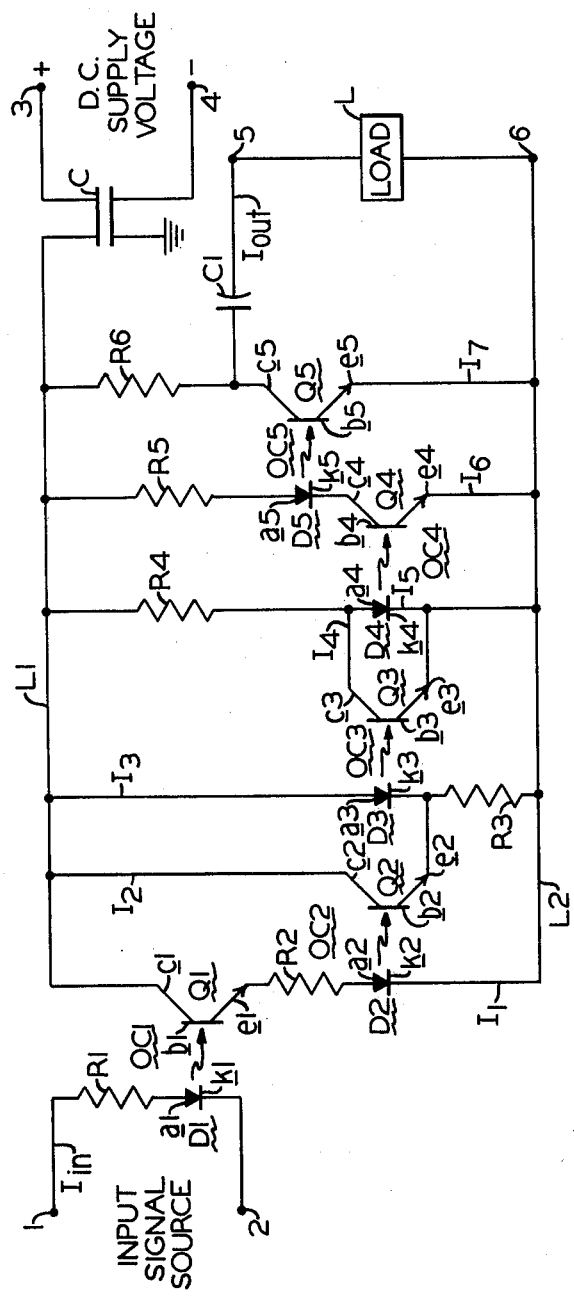
Fig. 1
Fig. 2
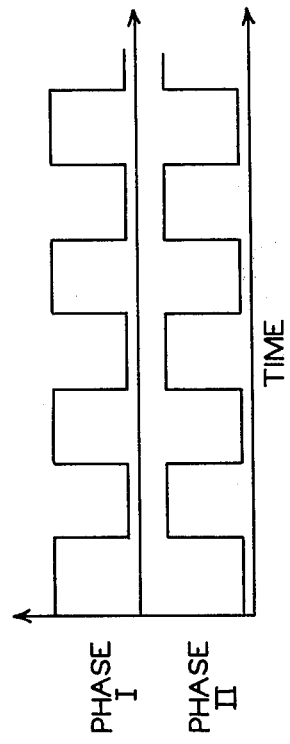
Fig. 3

FAIL-SAFE OPTO-ELECTRONIC PHASE INVERTING CIRCUITS

FIELD OF THE INVENTION

A fail-safe photon coupled isolator phase inverting circuit arrangement and more particularly to a vital type of opto-electronic phase reversal circuits including a plurality of cascaded optical coupler stages each having a light emitting input element and a light responsive output element for inverting an input signal 180° in the absence of a critical component or circuit failure.

BACKGROUND OF THE INVENTION

Signal inverting circuits have many applications and find wide usage in logic networks to perform various functions, in vital systems, for example, in railroad mass and/or rapid transit operations. In the past, the necessary logic functions were accomplished by electrical and electronic devices and networks, such as, electromagnetic relays and transistor circuits. While electromagnetic relays operated successfully in previously designed logic systems, their usage was accompanied by several shortcomings, such as, bulkiness in size and weight, slowness of response, namely, long pick up and drop out times, sensitivity to shock and vibrations and susceptibility of contact bounce and wear. Similarly, in transistor logic systems some difficulty has been encountered in regard to interfacing and isolation, and in many transistor logic arrangements ancillary self-checking circuits were generally utilized in vital applications in order to ensure that the system was operating properly and that no critical failure was present. It has been found an opto-electronic inverter employing optical coupling devices perform very satisfactorily and provide additional advantages over those achieved by prior art inverters. For example, optical couplers exhibit low capacitance from input to output and no feedback occurs from the output to the input. Other attributes possessed by optical couplers are fast transfer speed, small size, high immunity to shock and vibrations, wide range of frequency response and long lived. In addition, optical couplers have a wide range of current transfer ratios which may vary from fractions of a percent to hundreds of percent. Thus, the characteristics and versatility of optical couplers make them ideally suited for direct use with logic circuits and for interfacing power with logic or vice versa and logic system with logic system due to their extremely good isolation qualities. Further, it will be appreciated that in any vital system it is of paramount importance to exercise extreme care in designing and assembling the various networks and circuits of the system in order to preclude possible injury to individuals and prevent costly damage to equipment in case a critical component or circuit fails. That is, it is a fundamental authoritative requisition that under no circumstance will any conceivable failure cause or be capable of causing a true or valid output condition. This stringent requirement for vitality is essential in order to provide the highest degree of safety to individuals as well as apparatus. In order to achieve such a vital operation, the present inverting circuit has been specifically designed in accordance with the fail-safe principles approved by the Association of American Railroads (AAR). Thus, a critical circuit or component failure, such as, an open or short circuited malfunction must not be capable of erroneously simulating a valid output condition.

OBJECTS OF THE INVENTION

Accordingly, it is an object of this invention to provide a fail-safe circuit employing optical couplers for inverting periodic signals 180°.

Another object of this invention is to provide an opto-electronic phase inverting circuit arrangement which operates in a fail-safe manner.

A further object of this invention is to provide a vital type of inverter employing opto-electronic means having light emitting means and light responsive means.

Yet another object of this invention is to provide a vital opto-electronic phase inverting circuit arrangement utilizing a plurality of optical coupled isolators for phase reversing periodic input signals.

Yet a further object of this invention is to provide a fail-safe phase reversal circuit arrangement which employs a plurality of optical coupler stages each including a light emitting diode and a light sensitive transistor.

Still another object of this invention is to provide a new and improved vital circuit arrangement having a plurality of photon coupled isolators for phase shifting square-wave input signals 180°.

Still a further object of this invention is to provide unique phase inverting circuits for phase reversing periodic input signals in the absence of a critical component or circuit failure.

An additional object of this invention is to provide a novel fail-safe opto-electronic inverter which is economical in cost, simple in design, reliable in operation, durable in service and efficient in use.

SUMMARY OF THE INVENTION

In accordance with the present invention, the electronic phase inverting circuit arrangement includes a plurality of cascaded photon coupled isolators. Each of the photon coupled isolators includes a light emitting diode and an associated light responsive transistor. A source of square-wave input signals is connected to a light emitting diode of a first photon coupled isolator so that inphase pulses of light are directed onto the first light responsive transistor to control its conductive condition. The first light responsive transistor is connected to a light emitting diode of a second photon coupled isolator so the inphase pulses of light are directed onto the second light responsive transistor to control its conductive condition. The second light responsive transistor is coupled in parallel with a light emitting diode of a third photon coupled isolator so that out-of-phase pulses of light are directed onto the third light responsive transistor to correspondingly control its conductive condition. The third light responsive transistor is connected in multiple with a fourth photon coupled isolator so that inphase pulses of light are directed onto the fourth light responsive transistor to control its conductive condition. The fourth light responsive transistor is connected to a light emitting diode of a fifth photon coupled isolator so that inphase pulses of light are directed onto the fourth light responsive transistor to control its conductive condition which in turn results in square-wave output signals having a 180° phase shift relative to the square-wave input signals.

In a two stage version of an inverting circuit arrangement inphase pulses of light directed onto the light responsive transistor of the second photon coupled isolator inverts the pulses of light emanating from the third light emitting diode so that the conductive condition of the light responsive transistor of the third photon coupler isolator is phase reversed in relation to square-wave input signals.

In another two stage version, the phase reversal of the light responsive transistor of the third photon coupled isolator inverts the pulses of light emanating from the fourth light emitting diode so that the conductive condition of the light responsive transistor of the fourth photon coupler isolator reverses and becomes inphase with the square-wave input signals.

BRIEF DESCRIPTION OF THE DRAWINGS

The foregoing objects and other attendant features and advantages of this invention will become more fully evident from the following detailed description when analyzed and considered in conjunction with the accompanying drawings wherein:

FIG. 1 is a schematic circuit diagram illustrating a vital or fail-safe opto-electronic phase inverting circuit arrangement incorporating the unique features of the present invention.

FIG. 2 is a graphical illustration of waveforms of the phases encountered in the circuit of FIG. 1.

FIG. 3 illustrates a table of the various circuit currents versus the phases of FIG. 1.

DESCRIPTION OF THE INVENTION

Figure 4:
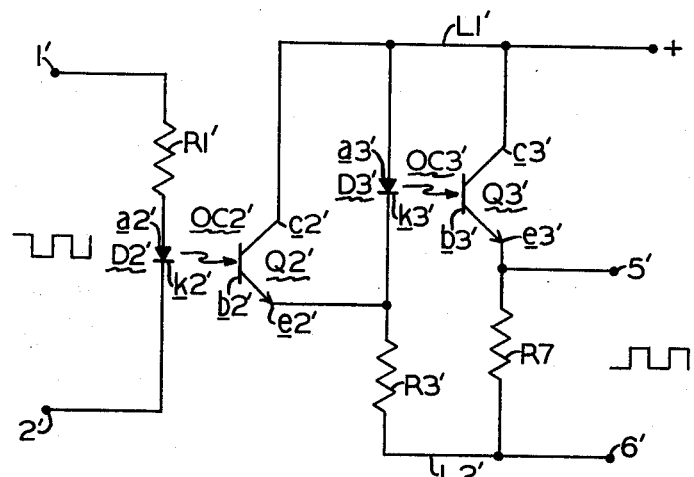
FIG. 4 is a schematic circuit diagram illustrating a two stage version vital or fail-safe opto-electronic phase inverter in accordance with the present invention.

Referring now to the drawings and in particular to FIG. 1, there is shown a vital type of signal phase inverting circuit employing a plurality of cascaded opto-electronic stages. Each of the opto-electronic stages includes photon coupled isolator or optical coupler in the form of a light emitting means or device and a light responsive means or device. The light emitting means of each of the photon coupled isolators is illustrated as a light emitting diode (LED) while the light responsive means of each of the photon coupled isolators is shown as a light sensitive NPN transistor.

As shown, the first or input stage includes an optoelectronic coupler OC1 having a light emitting diode D1 which is isolated from a light sensitive NPN transistor Q1. The anode electrode of diode D1 is connected to one end of a current limiting resistor R1. The other end of resistor R1 is connected to input terminal 1 while the cathode electrode of diode D1 is connected to input terminal 2. The input terminals 1 and 2 are supplied with suitable periodic input signals from an appropriate source, such as, a square-wave signal generator or the like (not shown). In the instance case, the solid-state or semiconductive diode D1 is characterized by the emission of optical radiation of a characteristic wavelength when a forward current is caused to flow through its junction by a positive voltage pulse which biases the anode electrode $a1$ positive with respect to the cathode electrode $c1$. The pulses of radiant energy or light emanating from diode D1 are directed onto and impinge upon the NPN transistor Q1 having a base electrode $b1$, a collector electrode $c1$ and emitter electrode $e1$. The pulses of illumination impinging on the base region $b1$ of transistor Q1 causes current to flow between collector electrode $c1$ and the emitter electrode $e1$. It will be noted that the collector electrode $c1$ is directly connected to the upper positive plate of a four-terminal capacitor C via voltage supply lead L1. The lower plate of capacitor C is directly grounded. The upper and lower plates are also connected to d.c. supply terminals 3 and 4, respectively. Terminal 3 is connected to the positive terminal of a suitable source of d.c. operating potential (not shown) while the terminal 4 is connected to the negative terminal of the d.c. supply voltage. The employment of a four-terminal capacitor C is essential in order to preclude an increase in the d.c. supply voltage level due to the accidental loss of a lead or conductor from the capacitor. For example, in a conventional two terminal capacitor filtered voltage supply circuit, an open circuit or inadvertent disconnection of a lead causes an increase in the average voltage due to the presence of superimposed ripple voltages and spurious noise pulses. The use of a four-terminal capacitor C positively prevents passage of pulses or ripples because the integrity of the supply circuit is destroyed by the loss of any lead or conductor. As shown, the emitter electrode $e1$ is connected to anode electrode $a2$ of light emitting diode D2 of the second or intermediate photon coupler isolator OC2 via a current limiting resistor R2 while the cathode electrode $k2$ of diode D2 is directly connected to common lead L2. The optical coupler OC2 of the second stage also includes an NPN light sensitive transistor Q2 having a base region $b2$, a collector electrode $c2$ and an emitter electrode $e2$. Thus, the light pulses emanating from the diode D2 are played onto the base region $b2$ to control the flow of current between collector electrode $c2$ and emitter electrode $e2$. Like collector electrode $c1$, the collector electrode $c2$ is directly connected to supply lead L1 while the emitter electrode $e2$ is connected to the junction formed between current limiting resistor R3 and diode D3 of a third photon coupled isolator OC3. The anode electrode $a3$ of diode D3 is connected to lead L1 while the cathode electrode $k3$ is connected through current limiting resistor R3 to lead L2. The diode D3 is isolated from NPN transistor Q3 of the optical coupler OC3 which forms an inverting stage, as will be described hereinafter. The NPN transistor Q3 includes a base region $b3$ which receives pulses of light produced by the light emitting diode D3 to control the flow of current between collector and emitter electrodes $c3$ and $e3$, respectively. As shown, the transistor Q3 is connected in parallel with light emitting diode D4 of the fourth or inverting photon coupled isolator OC4. The diode D4 includes an anode electrode $a4$ which is connected via current limiting resistor R4 to lead L1. The diode D4 includes a cathode electrode $k4$ which is commonly connected to emitter electrode $e3$ and lead L2. The diode D4 is optically coupled to base region $b4$ of NPN transistor Q4 to control its conductive condition. The light sensitive transistor Q4 includes an emitter electrode $e4$ which is directly connected to common lead L2. The transistor Q4 also includes a collector electrode $c4$ which is connected to cathode electrode $k5$ of light emitting diode D5 of a fifth or output photon coupled isolator OC5. The anode electrode $a5$ of diode D5 is connected to lead L1 via current limiting resistor R5. The pulses of light emanating from diode D5 are coupld to base region $b5$ of output NPN light sensitive transistor Q5 of optical coupler OC5. The transistor Q5 includes an emitter electrode e5 which is directly connected to common lead L2. The transistor Q5 also includes a collector electrode c5 which is connected to positive d.c. supply lead L1 via load resistor R6. The output is derived from collector electrode c5 and is connected by coupling capacitor c1 to a suitable load L. Thus, periodic or square-wave output signals are developed across the upper output terminal 5 and lower output terminal 6 which is common to lead L2.

Turning now to the operation of the subject invention, it will be assumed that all of the components and elements are perfect, that all connections have been made and are intact and that the circuit is operating properly. In describing the operation of FIG. 1, it will be of benefit to also refer to FIG. 2 which illustrates the waveforms of phases I and II and to FIG. 3 which shows the levels of various currents in the circuit in relation to phases I and II. Let us suppose that input signals of the type shown by phase I of FIG. 2 are being applied to input terminals 1 and 2 from the above-mentioned square-wave signal generator. It will be observed that initially the square-wave signal is "UP" and forwardly biases the light emitting diode D1 since input terminal 1 will be positive relative to terminal 2. The forward biasing and the flow of current $I_{in}$ through diode D1 causes optical radiation to be emitted and to be directed onto the base region $b1$ of the photosensitive transistor Q1. Thus, transistor Q1 conducts and current $I_1$ flows through resistor R2 and light emitting diode D2. Hence, the current $I_1$ is inphase with input current $I_{in}$. The current $I_1$ causes diode D2 to be illuminated so that optical radiation strikes the base region $b2$ of photosensitive transistor Q2. The optical radiation causes current $I_2$ to flow through collector-emitter electrodes $c2 - e2$ and through resistor R3. Thus, diode D3 is shunted by the conduction of transistor Q2 of transistor is nonconductive so that current $I_3$ is substantially zero or "DOWN" at the momment, and therefore $I_3$ is inverted and out-of-phase with input current $I_{in}$. Hence, diode $D_3$ is not conducting, and thus no optical radiation impinges upon the base region $b3$ and transistor Q3 is non-conductive. The nonconduction of transistor Q3 prevents current from flowing through collector-emitter electrodes $c3-e3$ so that current $I_4$ is "DOWN" and out-of-phase with input current $I_{in}$. With transistor Q3 nonconducting current $I_5$ will flow through resistor R4 and diode D4 so light is directed upon the base region $b4$ of transistor Q4. The impinging light causes transistor Q4 to conduct and current $I_6$ flows through resistor R5 and diode D5. Hence, an inverting action occurs between the optical coupler OC3 and OC4 so that currents $I_5$ and $I_6$ are "UP" and are inphase with the input current $I_{in}$. The conduction of diode D5 causes rays of light to strike base region $b5$ of transistor Q5 thereby results in current $I_7$ flowing through resistor R6 and collector-emitter electrodes $c5-e6$. The conduction of transistor Q5 causes substantially the output current to be zero or "DOWN" so that the output across terminals 5 and 6 and load L is out-of-phase with the square-wave input signals applied to terminals 1 and 2. Thus, the respective levels of the currents are illustrated in FIG. 3 when phase I is initially applied to input terminals 1 and 2. That is, when input current $I_{in}$ is "UP", currents $I_1$, $I_2$, $I_5$, $I_6$ and $I_7$ are "UP" or inphase while currents $I_3$, $I_4$ and $I_{out}$ are DOWN or out-of-phase. Thus, when input signals having a waveform represented by phase I of FIG. 2 are applied to the input terminals 1 and 2, the output having a waveform illustrated by phase II of FIG. 2 will be developed across output terminals 5 and 6 and, in turn, across load L.

Conversely, when phase II type of input waveform is applied to input terminals 1 and 2, the input current $I_{in}$ is initially DOWN so that currents $I_1$, $I_2$, $I_5$, $I_6$ and $I_7$ are DOWN while currents $I_3$, $I_4$ and $I_{out}$ are UP. Thus, when input signals having a waveform represented by phase II of FIG. 2 are supplied on input terminals 1 and 2, the output having a waveform illustrated by phase I of FIG. 2 will be produced across terminals 5 and 6 and, in turn, across load L. Accordingly, a 180° phase shift or phase reversal is uniquely accomplished by use of the cascaded photon coupled isolators in the inverter circuit arrangement of FIG. 1.

It will be appreciated that complete isolation between the input and output is achieved without the need of ancillary elements, such as, isolation transformers or the like. More importantly, the presently described opto-electronic inverting circuit arrangement operates in a fail-safe manner in that no conceivable critical or component failure is capable of resulting in a 180° phase shift which will falsely simulate a valid or true operating condition. It will be noted that failure of any one or more of the optical couplers will destroy the integrity of the inverting circuit so an erroneous output signal will not be produced across load L. For example, a short or open circuited condition of any of the light emitting diodes will result in the destruction of the circuit integrity so that the necessary pulses of light will cease to be directed onto the base region of the respective light sensitive transistor. Similarly, the shorting or opening of any of the light sensitive transistors will result in the cessation of the required pulses of electrical signals so that the associated controlled diode will not become periodically lighted. The opening of any of the current limit resistors results in the elimination of the necessary input signals or operating voltage so that an unsafe condition condition, an inverted signal is not capable of being developed on the output terminals. In addition, the current limiting resistors are preferably constructed of a carbon composition by a select manufacturer so that it is virtually impossible for them to become short circuited. The circuit is meticulously designed and laid out to insure that leads in proximity of each other are incapable of touching each other to create a short circuit. The opening of a connection point or a broken lead destroyes the circuit integrity and results in a safe condition. As previously mentioned, the use of the fourterminal capacitor C insures that the loss of a lead will not cause an unsafe condition. The opening of a capacitor C1 is a safe failure in that the output circuit path is interrupted while the shorting of capacitor C1 is not a critical failure. Accordingly, it can be seen that the inverting circuit operates in a fail-safe fashion in that no critical component or circuit failure is capable of initiating an output condition which will result in a 180° phase shift.

Referring to FIG. 4, those components which correspond to elements used in the circuit arrangement of FIG. 1 are allocated the same reference numerals but primed. In the opto-electronic inverting circuit arrangement of FIG. 4, the phase reversal operation is accomplished by a simple two-stage photon coupled isolator configuration which obviously has less gain or current transfer ratio than five-stage configuration of FIG. 1. In this case, the first or input stage includes an optical coupler OC2' having a light emitting diode D2' and light sensitive transistor Q2'. As shown, a current limiting resistor R1' is connected between input terminal 1' and anode electrode a2' while the cathode electrode k2' of diode D2' is is directly connected to input terminal 2'. It will be observed that square-wave input signals similar to those representative by phase I of FIG. 2 are shown being applied to input terminals 1' and 2'. The associated light responsive transistor Q2' includes a light sensitive base region b2', emitter electrode e2' and collector electrode c2'. The collector electrode c2' is directly connected to the positive potential supply lead L1' which is preferably connected to the upper plate of a four-terminal capacitor. The emitter electrode e2' of transistor Q2' is connected to the junction of current limiting resistor R3' and light emitting diode D3' of the second stage photon coupled isolator OC3'. As shown, the anode electrode a3' of diode D3' is connected to supply lead L1' while the cathode electrode k3' is connected to one end of resistor R3'. The other end of resistor R3' is connected to common lead L2'. The optical radiation of diode D3' is directed onto base region b3' of transistor Q3'. The collector electrode c3' is directly connected to lead L1' while the emitter electrode is connected to load resistor R7 which in turn is connected to lead L2'. The output signals are developed on terminals 5' and 6' which are connected across resistor R7. Thus, a train of phase I input signals applied to terminals 1' and 2' are inverted by the circuit of FIG. 2 and appear across terminals 5' and 6' as phase II output signals.

Figure 5:
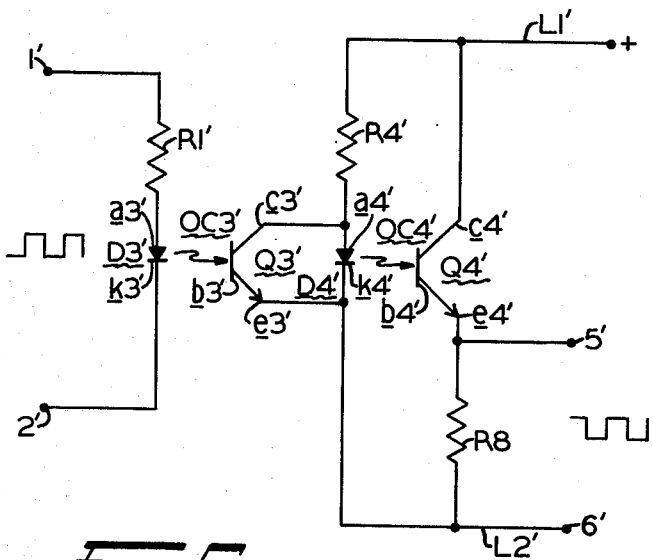
FIG. 5 is a schematic circuit diagram illustrating another two stage version vital or fail-safe opto-electronic phase inverter in accordance with the present invention.

Referring now to FIG. 5, those elements which correspond to the components used in the circuit arrangement of FIG. 1 are designated by the corresponding primed reference numerals. The inverting circuit of FIG. 4 is also a two-stage photon coupled isolator arrangement having a first input optical coupler OC3' and a second output optical coupler OC4'. The optical coupler OC3' includes a light emitting diode D3' having an anode electrode a3' and a cathode electrode k3'. The diode D3' is serially connected to a current limiting resistor R1' both of which are connected across input terminals 1' and 2' which are illustrated as having a series of square-wave signal pulses in the form of phase II applied thereto. The optical coupler OC3' of the input stage includes a photosensitive transistor Q3' having a base region b3', collector electrode c3' and emitter electrode e3'. The pulses of radiant energy impinging upon base electrode b3' cause current to flow through the collector-emitter electrodes c3' – e3' of transistor Q3'. As shown, the collector and emitter of transistor Q3' are connected in parallel with the light emitting diode D4' of the second stage optical coupler OC4'. A current limit resistor R4' connects the anode electrode a4' and the collector electrode c3' to the supply lead L1' while the cathode electrode k4' and emitter electrode e3' are directly connected to common lead L2'. The output optical coupler OC4' includes a photosensitive transistor Q4' having a base region b4', collector electrode c4' and emitter electrode e4'. The incident light emitted by diode D4' and directed onto base region b4' renders the transistor Q4' conductive. The collector electrode c4' is shown directly connected to lead L1' while the emitter electrode e4' is connected to lead L2' via load resistor R8. As shown, when a train of phase II square-wave signals are applied to input terminals 1' and 2', the diode D3' is initially nonconductive so that no light is directed onto base electrode b3'. With transistor Q3' nonconductive, current flows through diode D4' causing light to impinge upon base region b4' causing transistor Q4' to conduct. The conduction of transistor Q4' causes output terminal 5' to become positive relative to output terminal 6'. Thus, the DOWN portion of the input is inverted to an UP portion at the output. Conversely, the UP portion of the input is inverted to the DOWN portion at the output.

The inverting circuits of FIGS. 2 and 3, like the inverting circuit of FIG. 1, operate in a fail-safe manner in that failure of any passive or active element results in the elimination of the periodic signals or causes the removal of the necessary operating voltage.

It is well understood that other precautionary measures, such as discrete selection of appropriate components and highly sophisticated circuit layout have been employed in the design and the construction presently described of the inverting circuits.

It will be appreciated that while the present invention finds particular utility in logic circuits and the like in railroad and mass and/or rapid transit operations, it is understood that the invention may be employed in various other circuits and networks in other fields, such as, navigational, anti-collision, security, guidance and other systems which require the vitality and safety inherently present in the above described opto-electronic inverting circuits.

In addition, it will be understood that various changes, modificatons and alterations may be made without departing from the spirit and scope of the subject invention. For example, a greater or less number of optical coupler stages may be employed dependent upon the desired current gain or amplification requirements and phase shift characteristics. Additionally, it will be appreciated that other sources of periodic signals, such as, rectangular, saw-tooth sinusoidal, etc., may be applied to the input terminals. Further, it is understood that other types of photon coupled isolators may be used practicing the present invention. Other substitutions and ramifications will undoubtedly occur to those skilled in the art that are deemed to fall within the preview of the present invention which is intended to be limited only as set forth in the appended claims. Thus, it is understood that the showing and description of the present invention should be taken in an illustrative or diagrammatic sense only.

Having now described the invention what I claim as new and desire to secure by Letters Patent, is:

1. A fail-safe circuit arrangement comprising, a source of periodic input signals, opto-electronic means coupled to said source of periodic input signals, said opto-electronic means including having a plurality of cascaded optical couplers light emitting means in the form of light emitting diodes and light responsive means in the form of photon sensitive transistors for phase shifting said periodic input signals 180° in the absence of a critical component or circuit failure.

2. A fail-safe circuit arrangement as defined in claim 1, wherein said opto-electronic means includes a pair of optical couplers with each having a light emitting diode and a light responsive transistor, said light emitting diode of one of said pair of optical couplers illuminated and extinguished inphase with said periodic input signals so that said light responsive transistor of said one of said pair of said optical couplers is rendered conductive and nonconductive in accordance with the illumination and extinguishment of said light emitting diode of said one pair of said optical couplers, said light emitting diode of the other of said pair of said optical couplers is extinguished and illuminated by the conduction and nonconduction of said light responsive transistor of said one pair of said optical couplers and said light responsive transistor of said other pair of said optical couplers is rendered nonconductive and conductive by extinguishment and illumination of said light emitting diode of said other pair of said optical couplers which is out-of-phase with said periodic input signals.

3. A fail-safe circuit arrangement as defined in claim 1, wherein said opto-electronic means includes a pair of optical couplers with each having a light emitting diode and a light responsive transistor, aid light emitting diode of one of said pair of said optical couplers extinguished and illuminated inphase with said periodic input signals so that said light responsive transistor of said one pair of said optical couplers is rendered nonconductive and cnductive in accordance with the extinguishment and illumination of said light emitting diode of said one pair of said optical couplers, said light emitting diode of the other of said pair of said optical couplers is illuminated and extinguished by the nonconduction and conduction of said light responsive transistor of said one pair of said optical couplers and said light responsive transistor of said other pair of said optical couplers is rendered conductive and nonconductive by illumination and extinguishment of said other pair of said optical couplers which is out-of-phase with said periodic input signals.

4. A fail-safe circuit arrangement as defined in claim 1, wherein said source of periodic input signals is a square-wave signal source.

5. A fail-safe circuit arrangement as defined in claim 1, wherein said opto-electronic means includes a first, second, third, fourth and fifth light emitting and a first, second, third, fourth and fifth light responsive means, said first light emitting means coupled to said source of periodic input signals for alternately causing said first light emitting means and in turn said first light responsive means to turn on and off, the alternate turning on and off of said first light responsive means causing said second light emitting means and said second light responsive means to turn on and off, the alternate turning on and off of said second light responsive means causing said third light emitting means and said third light responsive means to turn off and on, the alternate turning off and on of said third light responsive means causing said fourth light emitting means and said light responsive means to turn on and off, the alternate turning on and off causing said fifth light emitting means and said fifth light responsive means to turn on and off, and the alternate turning on and off of said fifth light responsive means causing periodic output signals to be applied to a load.

6. A vital opto-electronic phase reversal circuit comprising, a source of square-wave signals, an input photon coupled isolator having a first light emitting diode and a first light sensitive transistor, said first light emitting diode coupled to said square-wave signal source so that pulses of illumination are directed onto said first light sensitive transistor, an output photon coupled isolator having a second light emitting diode and a second light sensitive transistor, said first light sensitive transistor coupled to said second light emitting diode and causing 180 degree shifted pulses of illumination to be directed onto said second light sensitive transistor so that inverted square-wave output signals are produced by said output photon coupled isolator.

7. A vital circuit arrangement comprising a pair of cascaded optical couplers each having a light emitting device and a light responsive device, a source of periodic input signals coupled to said light emitting device of one of said pair of said cascaded optical couplers for causing inphase periodic light signals to be directed onto said light responsive device of said one of said pair of said cascaded optical couplers and for causing inphase conduction of said light responsive device of said one of said pair of said cascaded optical coupler, said light responsive device of said one of said pair of said cascaded optical couplers coupled to said light emitting device of the other of said pair of said cascaded optical couplers for causing out-of-phase periodic light signals to be directed onto said light responsive device of said other of said pair of said cascaded optical couplers for causing out-of-phase conduction of said light responsive device of said other of said pair of said cascaded optical couplers so that out of phase periodic output signals are produced by said other of said pair of said cascaded optical couplers.

* * * * *